US009368380B2

(12) United States Patent
Yang et al.

(10) Patent No.: US 9,368,380 B2
(45) Date of Patent: Jun. 14, 2016

(54) SUBSTRATE PROCESSING DEVICE WITH CONNECTION SPACE

(71) Applicant: EUGENE TECHNOLOGY CO., LTD., Gyeonggi-do (KR)

(72) Inventors: Il-Kwang Yang, Gyeonggi-do (KR); Byoung-Gyu Song, Gyeonggi-do (KR); Kyong-Hun Kim, Gyeonggi-do (KR); Yong-Ki Kim, Chungcheongnam-do (KR); Yang-Sik Shin, Gyeonggi-do (KR)

(73) Assignee: EUGENE TECHNOLOGY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 14/766,299

(22) PCT Filed: Feb. 17, 2014

(86) PCT No.: PCT/KR2014/001258
§ 371 (c)(1),
(2) Date: Aug. 6, 2015

(87) PCT Pub. No.: WO2014/168331
PCT Pub. Date: Oct. 16, 2014

(65) Prior Publication Data
US 2016/0013086 A1 Jan. 14, 2016

(30) Foreign Application Priority Data
Apr. 8, 2013 (KR) ........................ 10-2013-0038077

(51) Int. Cl.
*H01L 21/677* (2006.01)
*H01L 21/673* (2006.01)

(52) U.S. Cl.
CPC .... *H01L 21/67303* (2013.01); *H01L 21/67757* (2013.01); *H01L 21/67778* (2013.01)

(58) Field of Classification Search
CPC ................................................ H01L 21/67757
See application file for complete search history.

(56) References Cited

U.S. PATENT DOCUMENTS

| 6,167,837 B1 | 1/2001 | Cook |
| 6,235,652 B1 | 5/2001 | Cook et al. |
| 6,287,635 B1 | 9/2001 | Cook et al. |

(Continued)

FOREIGN PATENT DOCUMENTS

| JP | 2006-303512 A | 11/2006 |
| KR | 10-2005-0060161 A | 6/2005 |
| KR | 10-2011-0113043 A | 10/2011 |

*Primary Examiner* — Gerald McClain
(74) *Attorney, Agent, or Firm* — Rabin & Berdo, P.C.

(57) ABSTRACT

Provided is a substrate processing apparatus. The substrate processing apparatus includes a chamber providing a stacking space in which a substrate is stacked and a process space in which a process with respect to the substrate is performed, a boat including at least one boat frame that vertically stands up, the boat being elevated to move into the stacking space and the process space, a plurality of susceptors disposed on the boat frame and spaced apart from each other along a longitudinal direction of the boat frame, wherein, as the boat moves into the process space, the substrate is successively loaded on a top surface of each of the plurality of susceptors, and at least holder including a vertical rod disposed parallel to the boat frame and a substrate support tip protruding from an inner surface of the vertical rod to support the substrate, wherein, when the boat moves into the process space, the vertical rod relatively moves along the longitudinal direction of the boat frame.

8 Claims, 9 Drawing Sheets

(56) References Cited

U.S. PATENT DOCUMENTS

| | | | |
|---|---|---|---|
| 6,321,680 B2 * | 11/2001 | Cook ............................ 118/625 |
| 6,352,593 B1 | 3/2002 | Brors et al. |
| 6,352,594 B2 | 3/2002 | Cook et al. |
| 6,506,691 B2 | 1/2003 | Cook et al. |
| 6,780,464 B2 | 8/2004 | Cook et al. |
| 7,077,912 B2 * | 7/2006 | Park ................. H01L 21/67309 |
| | | 118/715 |
| 7,207,763 B2 * | 4/2007 | Lee .................. H01L 21/67303 |
| | | 414/939 |
| 7,393,561 B2 | 7/2008 | Paranjpe |
| 7,921,803 B2 * | 4/2011 | Yudovsky ......... H01L 21/67248 |
| | | 118/712 |
| 2001/0029892 A1 | 10/2001 | Cook et al. |
| 2001/0041218 A1 | 11/2001 | Cook et al. |
| 2001/0047764 A1 | 12/2001 | Cook et al. |
| 2002/0028290 A1 | 3/2002 | Cook et al. |
| 2003/0049372 A1 * | 3/2003 | Cook ................. H01L 21/67754 |
| | | 427/248.1 |
| 2003/0134038 A1 | 7/2003 | Paranjpe |
| 2005/0013937 A1 | 1/2005 | Cook et al. |
| 2005/0126482 A1 * | 6/2005 | Jeong ...................... C23C 16/44 |
| | | 118/715 |
| 2005/0188923 A1 | 9/2005 | Cook et al. |

* cited by examiner

SUBSTRATE PROCESSING DEVICE WITH CONNECTION SPACE

TECHNICAL FIELD

The present invention disclosed herein relates to an apparatus for processing a substrate, and more particularly, to a batch type substrate processing apparatus that prevents a process film from being formed on a rear surface of a substrate due to a process gas.

BACKGROUND ART

Substrate processing apparatuses (thermal processing apparatuses) used for manufacturing semiconductors, flat panel displays, photovoltaic cells, and the like may be apparatuses that perform an essential thermal processing process for crystallizing and phase-changing a predetermined thin film that is deposited on a substrate such as a silicon wafer or a glass substrate. Typically, in case of manufacturing liquid crystal displays or thin-film crystalline silicon photovoltaic cells, there is a silicon crystallization apparatus for crystallizing amorphous silicon deposited on the a substrate into poly silicon.

To perform the above-described crystallization process (thermal processing process), a thermal processing apparatus that is capable of heating a substrate on which a predetermined thin film is formed is needed. For example, a temperature of minimum about 550° C. to about 600° C. is required for crystallizing amorphous silicon. Here, the thermal processing may means a process for heating an object or substrate at a desired temperature, i.e., a temperature of about 350° C. to about 1,300° C. The thermal processing on the semiconductor substrate may include, for example, heat processing, annealing, diffusing or driving of a dopant material, chemical deposition, i.e., deposition or growth of a material layer such as CVD, and an etching or removing of a material.

Typically, a substrate processing apparatus may be classified into a single wafer type substrate processing apparatus in which thermal processing is performed on one substrate and a batch type substrate processing apparatus in which thermal processing is performed on a plurality of substrates. The single wafer type substrate processing apparatus has an advantage in that its structure is simple. However, the single wafer type substrate process apparatus may be deteriorated in productivity. Thus, the batch type substrate processing apparatus may be in the spotlight.

The batch type substrate processing apparatus include a substrate loading boat for loading a plurality of substrates into a chamber to improve process processing performance. In the batch type substrate processing apparatus, since an edge of the substrate is locally mounted in a slot during the process, a film for the semiconductor process may be formed on a boat or slot that supports both surfaces and a lower portion of the semiconductor substrate during the film formation process.

Thus, when the substrate is unloaded after the film formation process for manufacturing a semiconductor is completed, the film integrally connected to the substrate and the slot may be broken. Thus, when the film is broken, particles may occur, and mechanical stress on the rear surface of the substrate may more increase to cause bending of the substrate. In addition, since film uniformity on the rear surface of the semiconductor substrate is significantly less than that on a front surface, this may cause a lot of trouble in following processes, particularly, a photolithography process.

DISCLOSURE

Technical Problem

The present invention provides a substrate processing apparatus that prevents a process film from being formed on a rear surface of a substrate.

Further another object of the present invention will become evident with reference to following detailed descriptions and accompanying drawings.

Technical Solution

Embodiments of the present invention provide substrate processing apparatuses including: a chamber providing a stacking space in which a substrate is stacked and a process space in which a process with respect to the substrate is performed; a boat including at least one boat frame that vertically stands up, the boat being elevated to move into the stacking space and the process space; a plurality of susceptors disposed on the boat frame and spaced apart from each other along a longitudinal direction of the boat frame, wherein, as the boat moves into the process space, the substrate is successively loaded on a top surface of each of the plurality of susceptors; and at least holder including a vertical rod disposed parallel to the boat frame and a substrate support tip protruding from an inner surface of the vertical rod to support the substrate, wherein, when the boat moves into the process space, the vertical rod relatively moves along the longitudinal direction of the boat frame.

In some embodiments, the chamber may have a connection space between the stacking space and the process space, and the substrate processing apparatuses may further include a grip plate disposed in the connection space to block the stacking space and the process space, the grip plate being connected to an upper end of the vertical rod to move together with the boat into the process space when the boat moves from the stacking space to the process space.

In other embodiments, the chamber may include: a lower chamber having an opened upper portion and a passage that is defined in one side thereof so that the substrate is accessible, the lower chamber providing the stacking space; and an upper chamber disposed on the lower chamber and having an opened lower portion communicating with the opened upper portion of the lower chamber, the upper chamber providing the process space.

In still other embodiments, the substrate processing apparatuses may further include a support ring disposed in the connection space, the support ring including a support protrusion protruding from an inner surface thereof to support the grip plate that is placed thereon.

In even other embodiments, the holder may relatively move through an insertion hole defined in the susceptor when the boat moves into the process space.

In yet other embodiments, the susceptor may have a seat groove that is recessed from a top surface of the susceptor and has a shape corresponding to that of the substrate, wherein the substrate may be seated in the seat groove.

In further embodiments, the substrate processing apparatuses may further include an upper blocking plate connected to an upper portion of the boat frame to left the grip plate when the boat moves into the process space.

In still further embodiments, the upper blocking plate may have a through hole defined in a position correspond to that of the holder, and the holder may be movable through the through hole when the boat moves into the process space.

In even further embodiments, the boat frame may include susceptor support tips protruding from an inner surface thereof to support the susceptor, the susceptor support tips being spaced apart from each other along the longitudinal direction of the boat frame.

Advantageous Effects

According to the embodiment of the present invention, it may prevent the process film from being formed on the rear surface of the substrate due to the loading of the substrate on the susceptor. Thus, the yield of the substrate may be improved to improve productivity of the substrate.

BEST MODE

Figure 1:
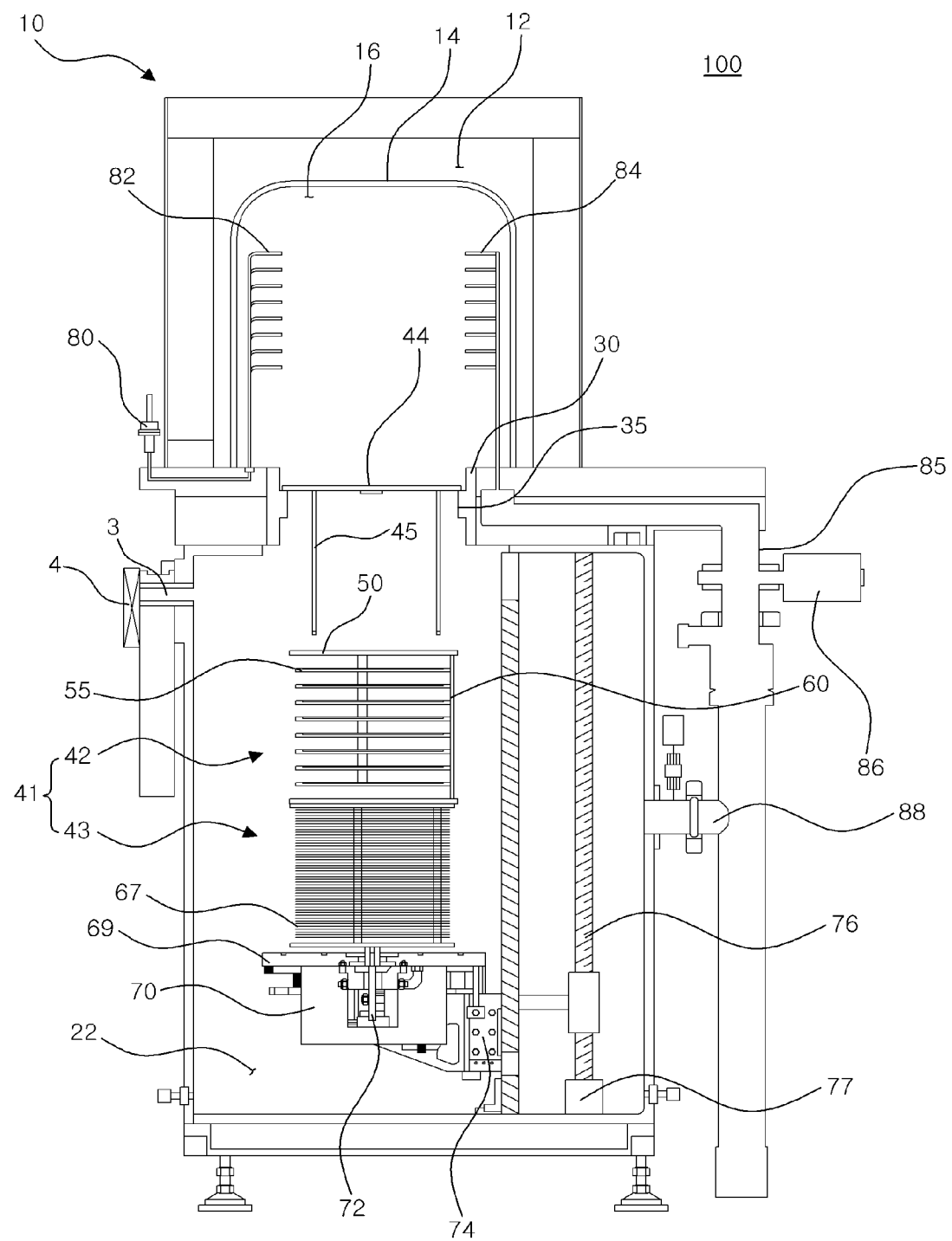
FIG. 1 is a schematic view of a substrate processing apparatus according to an embodiment of the present invention.

Hereinafter, exemplary embodiments of the present invention will be described in detail with reference to FIGS. 1 to 11. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the drawings, the thicknesses of layers and regions are exaggerated for clarity.

It is obvious to a person skilled in the art that the embodiments of the present invention are applicable to various objects to be processed in addition to the substrate W that is described in the current embodiments. For example, the present invention is not limited to a kind of substrate to be processed. Thus, substrates formed of various materials such as glass, plastic, polymer, silicon wafer, stainless steel, sapphire materials and the like, which are generally used in the overall semiconductor manufacturing process. Also, the processing of the substrate may be understood as processing of a predetermined or pattern formed on the substrate as well as processing of the substrate itself.

Also, the present invention is not limited to use of the substrate processing apparatus. Thus, the overall semiconductor processes, for example, a deposition process, an etching process, a surface processing process, and the like may be performed by using the substrate processing apparatus according to the present invention. In addition, only main components of the present invention will be described below. Also, it is obvious that various components may be additionally provided to the substrate processing apparatus of the present invention according to purpose of utilization.

Figure 2:
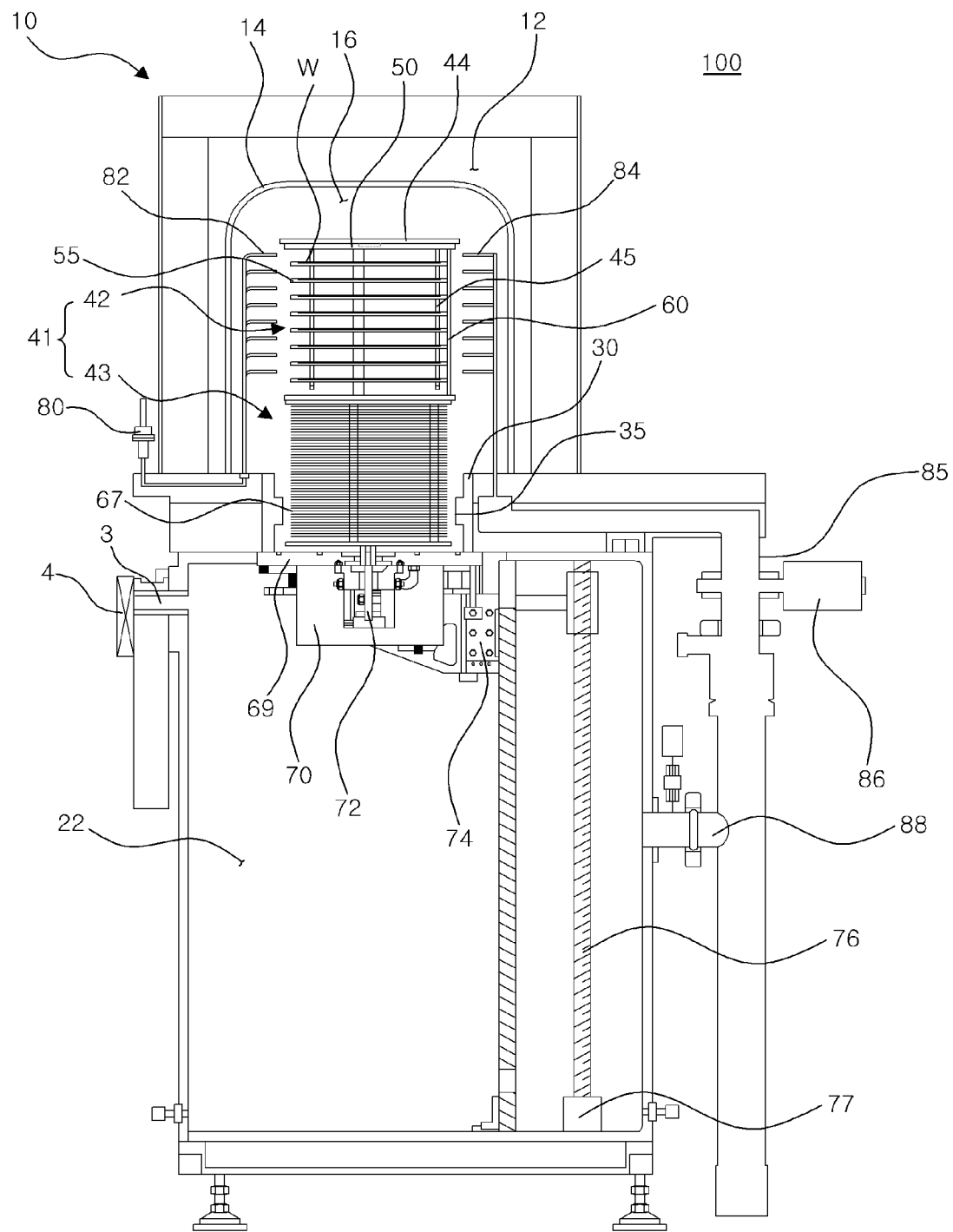
FIG. 2 is a view of a state in which a boat of FIG. 1 is switched into a process position.

FIG. 1 is a schematic view of a substrate processing apparatus according to an embodiment of the present invention, and FIG. 2 is a view of a state in which a boat of FIG. 1 is switched into a process position. Referring to FIGS. 1 and 2, a substrate processing apparatus 100 includes a lower chamber 20 having an opened upper portion and a process chamber 10 closing the opened upper portion of the lower chamber 20 to provide a process space 12 in which a process with respect to a substrate W is performed. A support ring 30 may be disposed on an opened lower portion of the process chamber 10 and the opened upper portion of the lower chamber 20 (i.e., a connection space). The support ring 30 may include a support protrusion 35 protruding from an inner circumferential surface thereof.

The lower chamber 20 may have a passage 3 through which the substrate W is transferred. Thus, the substrate W may be transferred into the lower chamber 20 through the passage 3. For example, the passage 3 of the lower chamber 20 may be connected to a transfer chamber (not shown) connected to a plurality of process chambers. Thus, the substrate W may be transferred from the transfer chamber into the lower chamber 20 by an end-effector (see reference numeral 65 of FIG. 5). A gate valve 4 may be disposed outside the passage 3, and the passage 3 may be opened or closed by the gate valve 4.

A boat 41 on which a plurality of substrates W to be transferred through the passage 3 are stacked is disposed inside the substrate processing apparatus 100. While the boat 41 is positioned in a stacking space 22 (or at a "stacking position") that is provided in the lower chamber 20, the substrates W may be stacked in the boat 20. The boat 20 may include an upper boat 42 on which the substrate is stacked and a lower boat 42 connected to a lower portion of the upper boat 42 to support the upper boat 42. When the boat is switched into the process position, a plurality of insulation plates 67 may be disposed on the lower boat 43 to minimize heat losses within the process chamber 10 through the opened lower portion of the process chamber 20.

As described below, a boat unit 40 may include an upper boat 42 including a susceptor 55 on which the substrate W is stacked, a lower boat 43 including the insulation plates 67, and a grip plate 44 for loading the substrate W onto the susceptor 55, a holder 45, and an upper blocking plate 50. In the susceptor 55, the substrates W may be placed on susceptor support tips (see reference number 62 of FIG. 5) (or slots), which parallelly protrude in an inner direction of the boat 41. As described below, as the boat 41 ascends, the substrates W may be successively vertically stacked on susceptor 55 that is placed on the next susceptor support tip (see reference numeral 62 of FIG. 5). The substrates W may be stacked on the susceptor 50, and the boat 41 may move into an internal reaction tube 14 (or a "process position") to perform a process with respect to the substrate W.

Also, a base plate 69 may be disposed under the lower boat 43. The base plate 69 may be elevated together with the boat 41. When the boat 41 is switched into the process position, the base plate 69 may close the process space 16. Each of the insulation plates 67 and the base plate 69 may be formed of ceramic, quartz, or metal coated with ceramic. While the process is performed, transfer of heat within a reaction region into the stacking space 22 may be minimized.

A motor housing 70 is disposed under the base plate 29. A rotation shaft 72 has one side connected to the lower boat 43. A rotation motor (not shown) for rotating the rotation shaft 72 may be fixed to the inside of the motor housing 70. When the boat 41 is switched into the process position to perform the process with respect to the substrate W, the rotation motor may drive the rotation shaft 72 to rotate the boat 41 together with the rotation shaft 72.

The motor housing 70 is fixed to a bracket 74, and the bracket 74 is elevated along an elevation rod 76 connected to the lower chamber 20. The bracket 74 is screw-coupled to the elevation rod 74. The elevation rod 74 may be connected to an elevation motor 77 to elevate the bracket 74 by the rotation of the elevation rod 74. That is, the elevation rod 74 may be rotated by the rotation of the elevation motor 77. Thus, the bracket 74 and the motor housing 70 may be elevated together with each other.

The process chamber 10 has an inner space 12 in which the process with respect to the substrate W is performed. The internal reaction tube 14 is disposed in the inner space 12. The internal reaction tube 14 provides the process space 16 in which the process with respect to the substrate W is performed. The internal reaction tube 14 partitions the inside of the process chamber 10 into the inner space 12 and the process space 16. That is, as illustrated in FIG. 2, when the boat 41 ascends into the process space 16 and is switched into the process position, the process may be performed in a state where the process space 16 with respect to the substrate W is minimized.

The substrate processing apparatus 100 includes a heater (not shown) for heating the substrate W. For example, the heater may be provided in an upper portion of the process chamber 10 or along a sidewall of the process chamber 10. Also, the substrate processing apparatus 100 may include a plurality of supply nozzles 82 for supplying a process gas into the process space 16 and exhaust nozzles 84. The supply nozzles 82 are connected to a gas supply line 80 disposed on one side of the process chamber 10 to receive the process gas from the outside.

The process gas may be supplied onto the substrate W or exhausted through a supply hole and exhaust hole (not shown), which are respectively defined in the supply nozzles 82 and the exhaust nozzles 84. The supply hole and the exhaust hole may be defined at heights different from each other. The supply nozzles and the supply hole may be disposed in the process space 14 to supply the reaction gas onto the stacked substrates W. Also, each of the exhaust nozzles 84 may be disposed at a side opposite to each of the supply nozzles 82 to discharge a non-reaction gas and reaction byproducts to the outside which are generated during the processes.

The exhaust nozzles 84 are connected to a first output line 85. The non-reaction gas and reaction byproducts which are suctioned through the exhaust nozzles 84 are discharged through a first output line 85. An output valve (not shown) may be disposed in the first output line 85 to open or close the first output line 85. Also, a turbopump 86 may be disposed on the first output line 85 to forcibly discharge the non-reaction gas and reaction byproducts. Also, the lower chamber 20 may be connected to a second output line 88 to exhaust the inside of the stacking space 22 through the second output line 88.

As described above, the substrate process apparatus 100 may include the boat 41 for loading the plurality of substrates W to improve process processing performance. If the process with respect to the substrate W is performed by using an existing boat unit 40, an edge of the substrate W placed on the slot of the boat 41 may be locally mounted. For example, when a process film is formed on the substrate W by using the process gas, the film for the process may be formed on all of the boat 41 and slots, which support both surface and a lower portion of the semiconductor substrate.

Thus, when the substrate W is unloaded after the film formation process for manufacturing a semiconductor is completed, the film integrally connected to the substrate W and the slots may be broken. Thus, when the film is broken, particles may occur, and mechanical stress on the rear surface of the substrate W may more increase to cause bending of the substrate W. In addition, since film uniformity on the rear surface of the substrate W is significantly less than that on a front surface, this may cause a lot of trouble in following processes, particularly, a photolithography process.

That is, in the substrate processing apparatus 100 according to the present invention, the substrate W may be loaded on the susceptor 55 to block the introduction of the process gas onto the rear surface of the substrate W, thereby preventing a film from being formed on the rear surface of the substrate W. The boat unit 40 for preventing the film from being formed on the rear surface of the substrate W will be described with reference to the following drawings.

Figure 3:
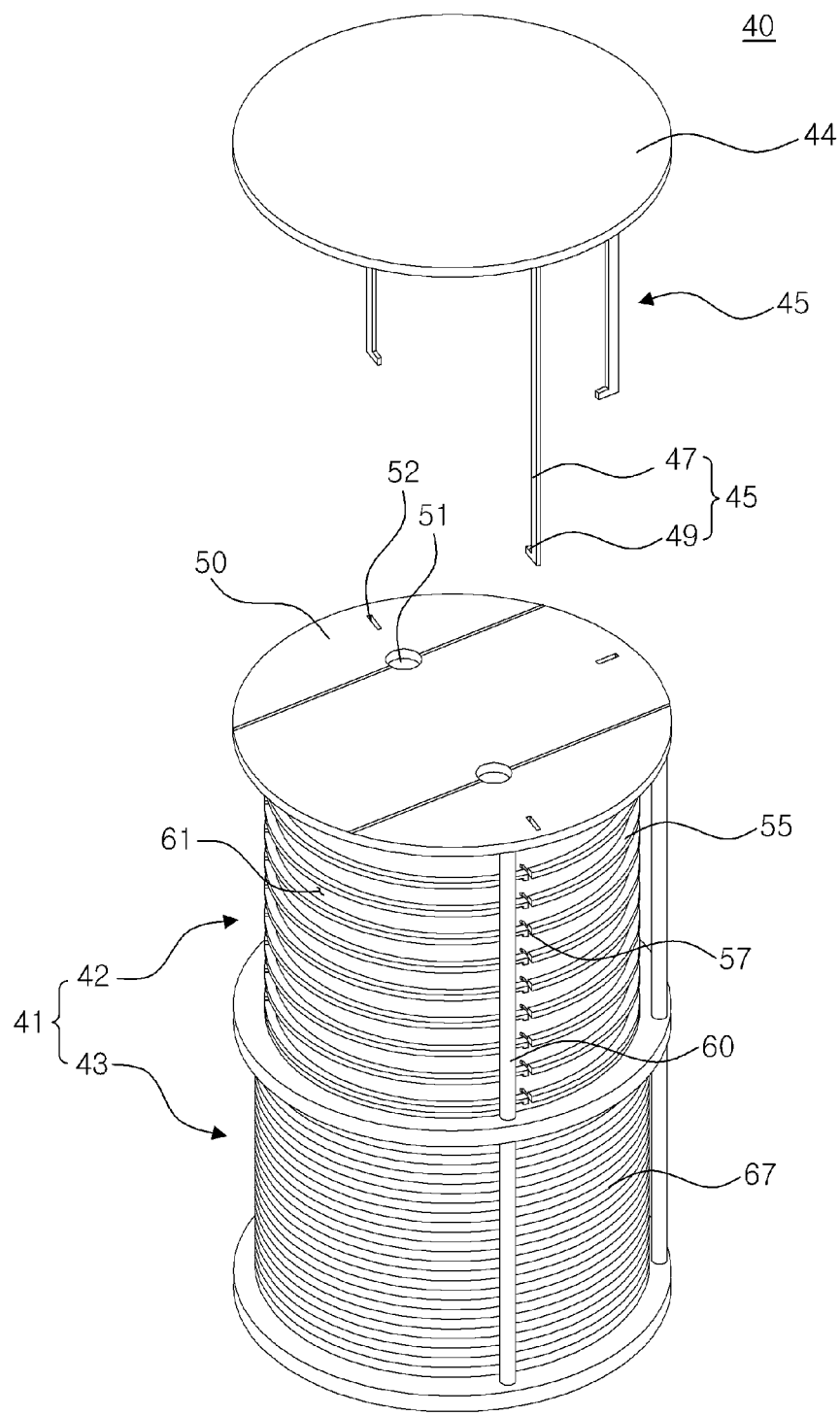
FIG. 3 is a perspective view of a boat unit of FIG. 1.
Figure 4:
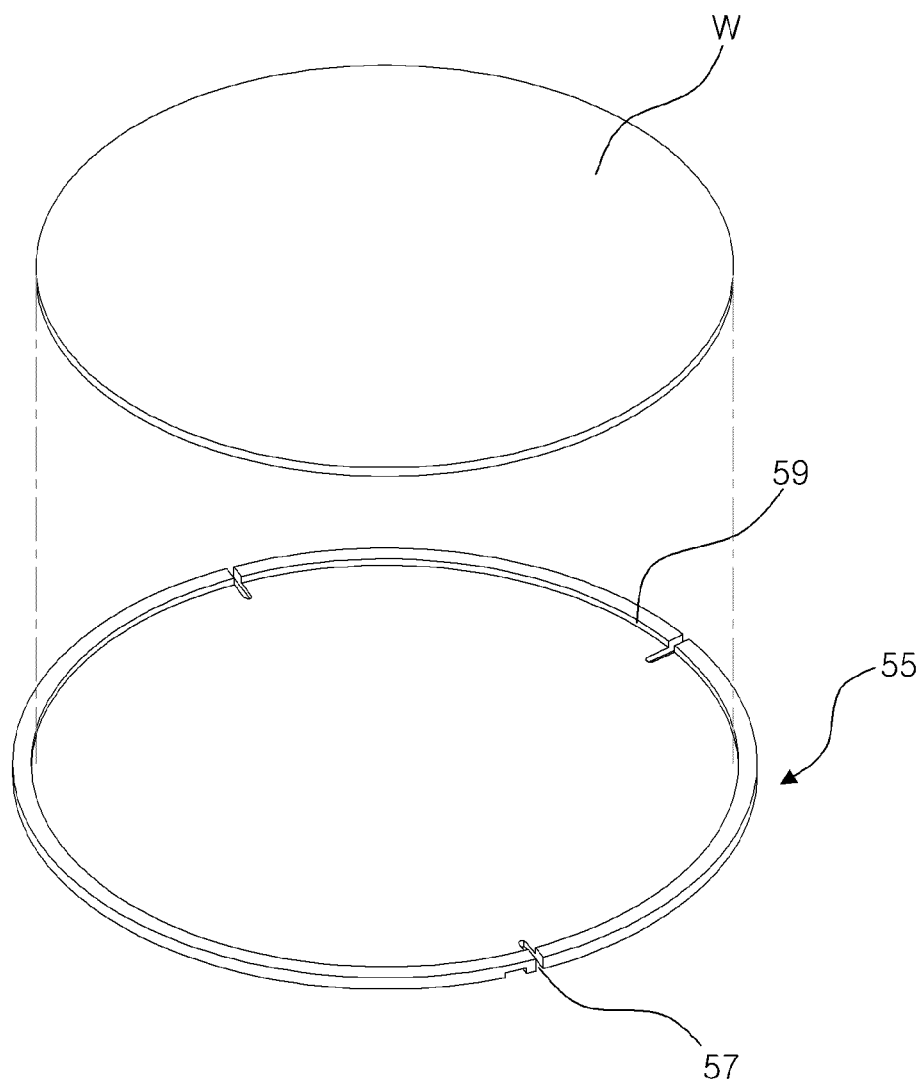
FIG. 4 is a view of a susceptor of FIG. 3.

FIG. 3 is a perspective view of a boat unit of FIG. 1, and FIG. 4 is a view of a susceptor of FIG. 3. Referring to FIGS. 3 and 4, the boat unit 40 includes an upper boat 42 and a lower boat 43. The upper boat 41 may include the susceptor 55 that is placed on the susceptor support tip (see reference numeral 62 of FIG. 5) of a pillar-shaped boat frame 60 and an upper blocking plate 50 connected to an upper portion of the boat frame 60. As described above, the insulation plate 67 may be disposed on the lower boat 43. Also, the boat unit 40 may further include a grip plate 44 and a holder 45. Hereinafter, omitted constitutions and operations may be substituted with the foregoing contents.

As described above, the support ring 30 may be fixed to the opened lower portion of the process chamber 10 and the opened upper portion of the lower chamber. The support ring 30 includes the support protrusion 35 protruding from an inner circumferential surface thereof. The grip plate 44 is disposed on the support protrusion 35. Also, the grip plate 44 may be supported by the support protrusion 35 to block the stacking space 22 and the process space 16. The holder 45 is vertically connected to a bottom surface of the grip plate 44. The holder 45 may be provided in plurality on preset positions to easily support the substrate W that is transferred by the end-effector (see reference numeral 65 of FIG. 5).

Figure 5:
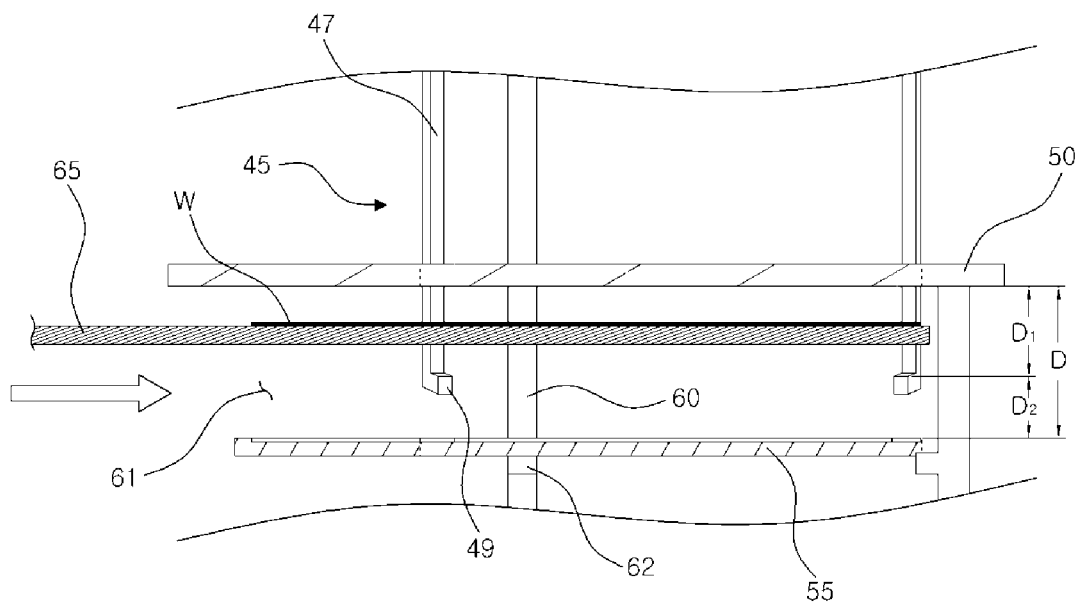
FIGS. 5 to 8 are views of a process in which a substrate is loaded onto the susceptor.

The holder 45 may include a vertical rod 47 vertically connected to the bottom surface of the grip plate 44 and a substrate support tip 49 connected to a lower end of the vertical rod 47 to support the substrate W transferred by the end-effector (see reference numeral 65 of FIG. 5). The substrate support tip 49 may protrude toward a center of the substrate W to easily support the loaded substrate W.

The upper boat 41 may includes a plurality of boat frames 60 each of which stands up in a pillar shape. A front opening 61 for taking the substrate W in or out through the end-effector (see reference numeral 65 of FIG. 5) is defined between the boat frames 60. The front opening 61 is formed by disposing the boat frames 60 along a semicircumference with respect to a working path of the end-effector (see reference numeral 65 of FIG. 5) that horizontally moves along a plane. The susceptor support tips (see reference numeral 62 of FIG. 5) may be spaced apart from each other along a longitudinal direction of the boat frame 60, and the susceptor 55 may be placed and supported on the upper portion of the susceptor support tip (see reference numeral 62 of FIG. 5).

The susceptor 55 may have a shape corresponding to that of the substrate W. Also, an insertion hole 57 in which the holder 45 is insertable may be defined in an edge of the susceptor 55. The susceptor 55 has a seat groove 59 on which the substrate W is seated so that the rear surface of the substrate W is closely attached. An outer circumferential surface of the substrate W is loaded on the seat groove 59. Thus, it may prevent the process gas from flowing onto the rear surface of the substrate W and the outer circumferential surface of the substrate W to prevent the film from being formed on the side and rear surfaces of the substrate W.

The upper blocking plate 50 may be connected to the upper portion of the boat frame 60. The upper blocking plate 50 may have a shape corresponding to that of the substrate W. The upper blocking plate 50 may have a cross-section less than that of the grip plate 44 and greater than that of the susceptor 55. A through hole 52 is defined in an inner surface of the upper blocking plate 50. The holder 45 may be inserted into the through hole 52. Also, a lower blocking plate (not shown) may be disposed under the boat frame 60. A lower boat 43 may be connected to a lower portion of the lower blocking plate. The lower boat 43 may be provided in a state in which the plurality of insulation plates 67 are stacked.

FIGS. 5 to 8 are views of a process in which a substrate is loaded onto the susceptor. As described above, the end-effector 65 transfers the substrate W through the passage 3 of the lower chamber 20. The substrate W placed on the end-effector 65 is transferred into the front opening 61 of the boat 41 through the lower chamber 20. A spaced space (pitch) D between the upper blocking plate 50 and the uppermost susceptor 55 and between the susceptors 55 that are successively stacked downward from the uppermost susceptor 50 may be provided as a working space of the end-effector 65. Also, the upper boat 41 may be elevated by a preset distance by an elevation unit (not shown) connected to a lower portion of the boat unit 40.

Figure 6:
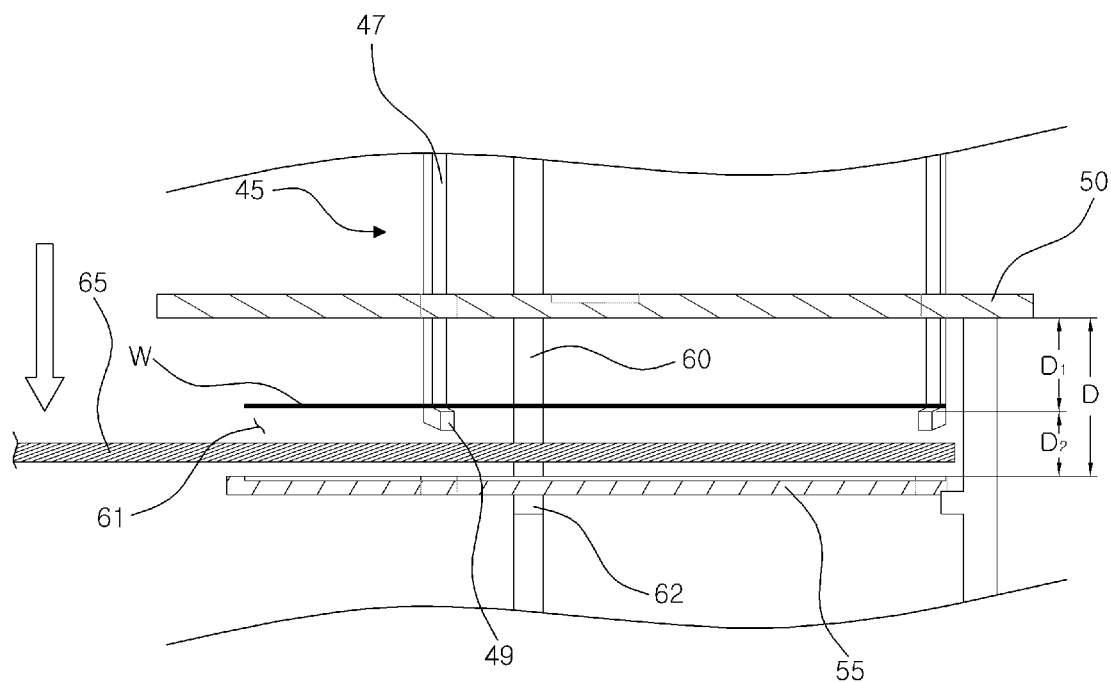

Referring to FIG. 5, the substrate support tip 49 may be disposed spaced a preset distance D2 from an upper portion of the susceptor 55 by passing through the through hole 52 of the upper blocking plate 50 as the boat 41 ascends. The end-effector 65 is inserted into the space D1 between the upper blocking plate 50 and the substrate support tip 49. Referring to FIG. 6, as the end-effector 65 descends, the substrate W may be seated on the substrate support tip 49, and the end-effector 65 may be disposed in the space D2 between the susceptor 55 and the substrate support tip 49.

Figure 7:
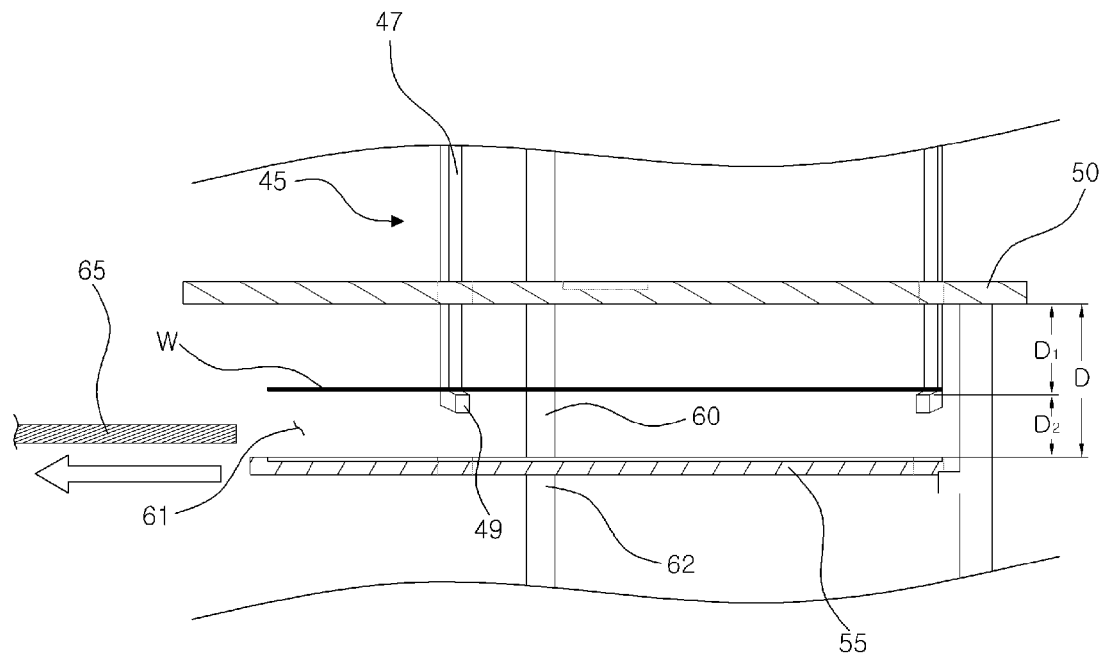
Figure 8:
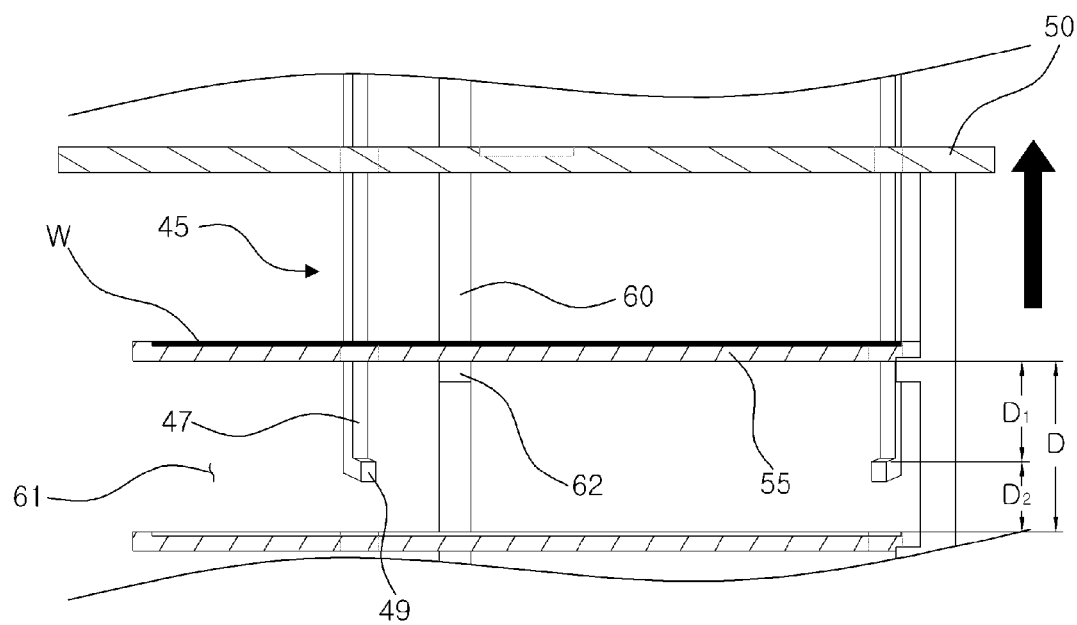

Referring to FIG. 7, after the substrate W is seated on the substrate support tip 49, the end-effector 65 may be taken out of the front opening 61 of the boat 41. Referring to FIG. 8, when the end-effector 65 is completely taken out of the front opening 61 of the boat 41, the boat 41 may ascend up to a preset height to load the substrate W on the seat groove 59 of the susceptor 55. The substrate support tip 49 may maintain the preset distance D1 between the uppermost susceptor 55 disposed by the ascending of the boat 41 and the susceptor 55 disposed immediately below the uppermost susceptor 55. The processes illustrated in FIGS. 5 to 8 may be successively repeated to load the substrate W on each of the stacked susceptors 55.

Figure 9:
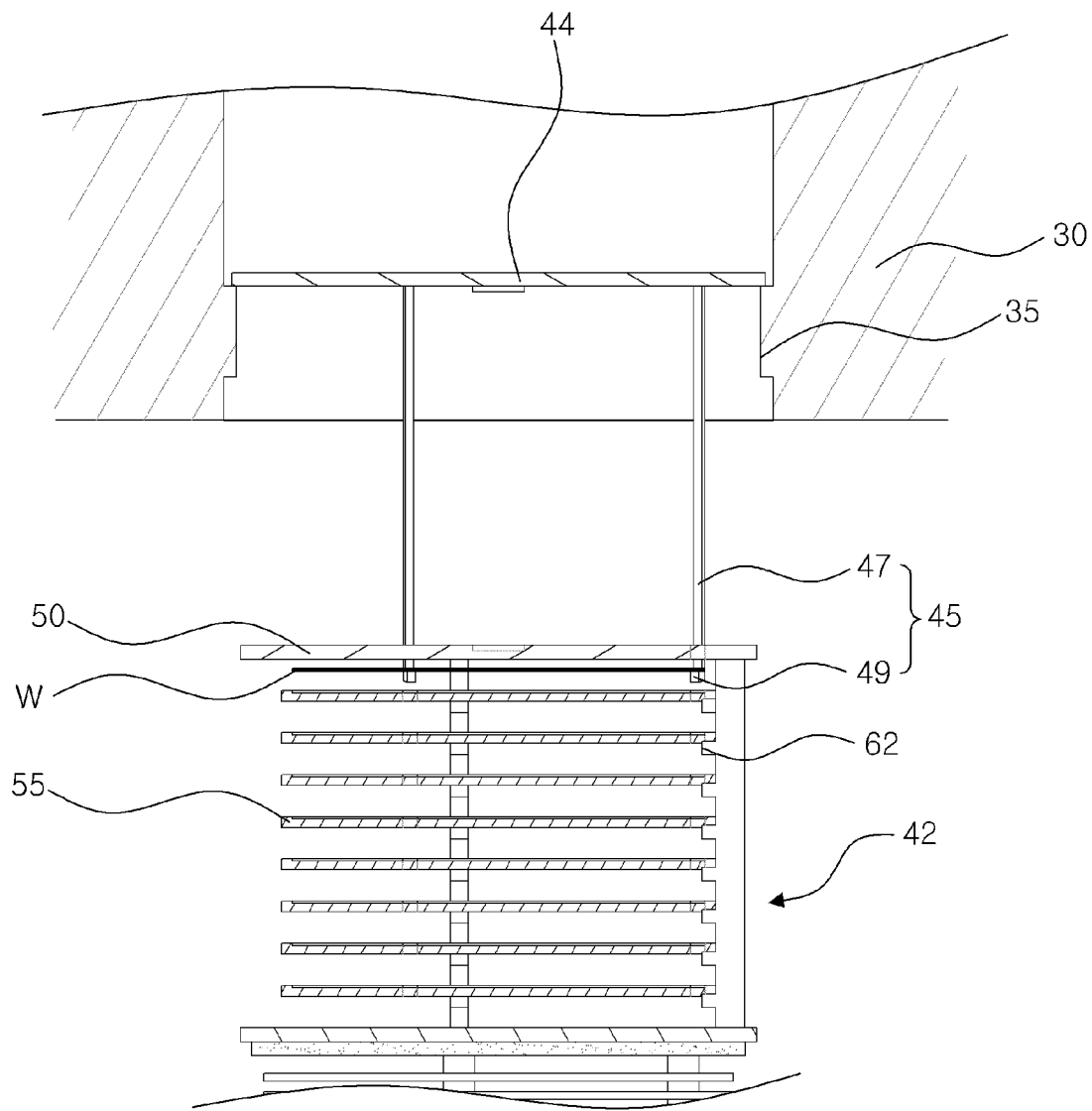
FIGS. 9 to 11 are views of a process in which the boat unit is switched into the process position.
Figure 10:
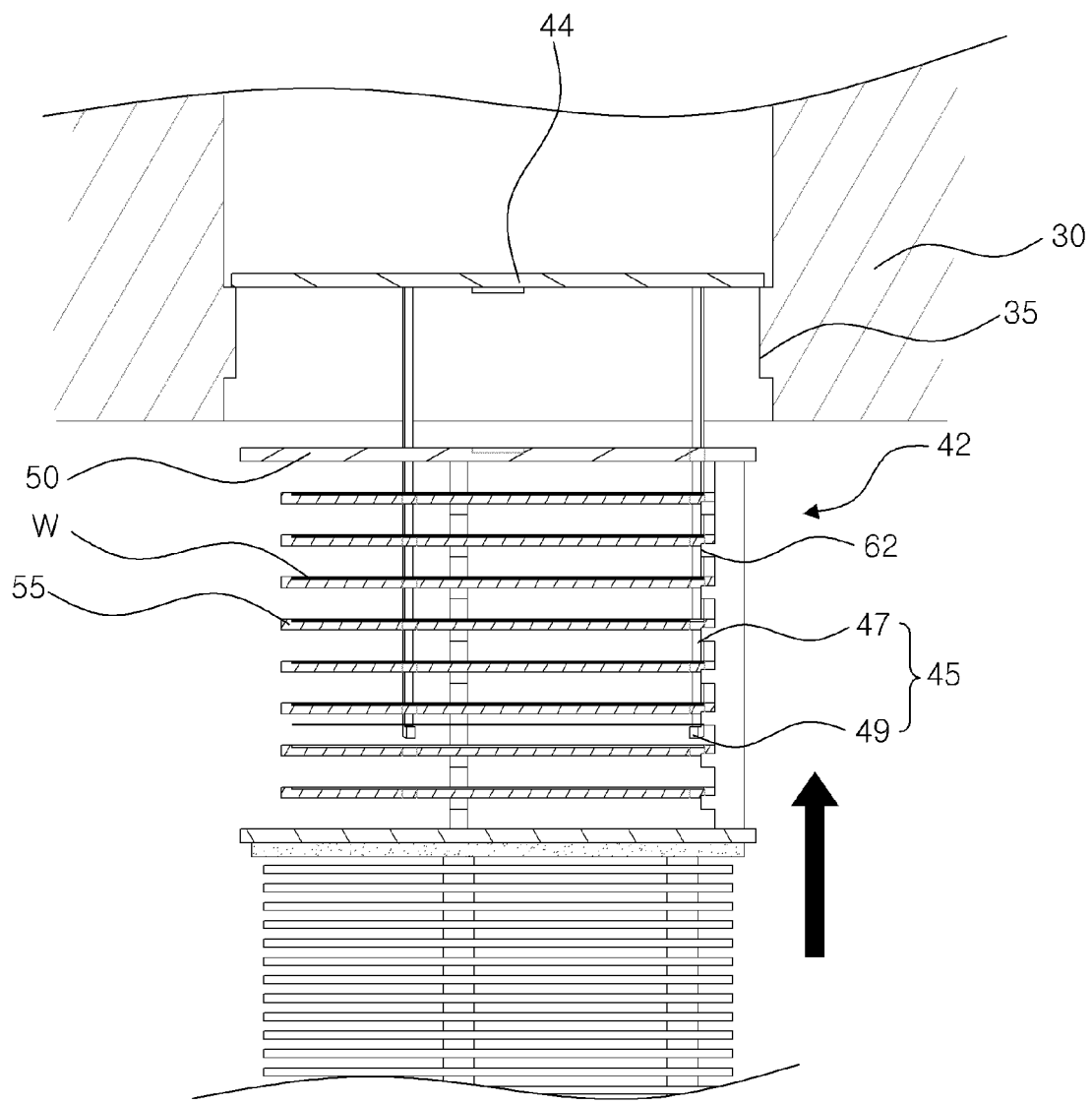
Figure 11:
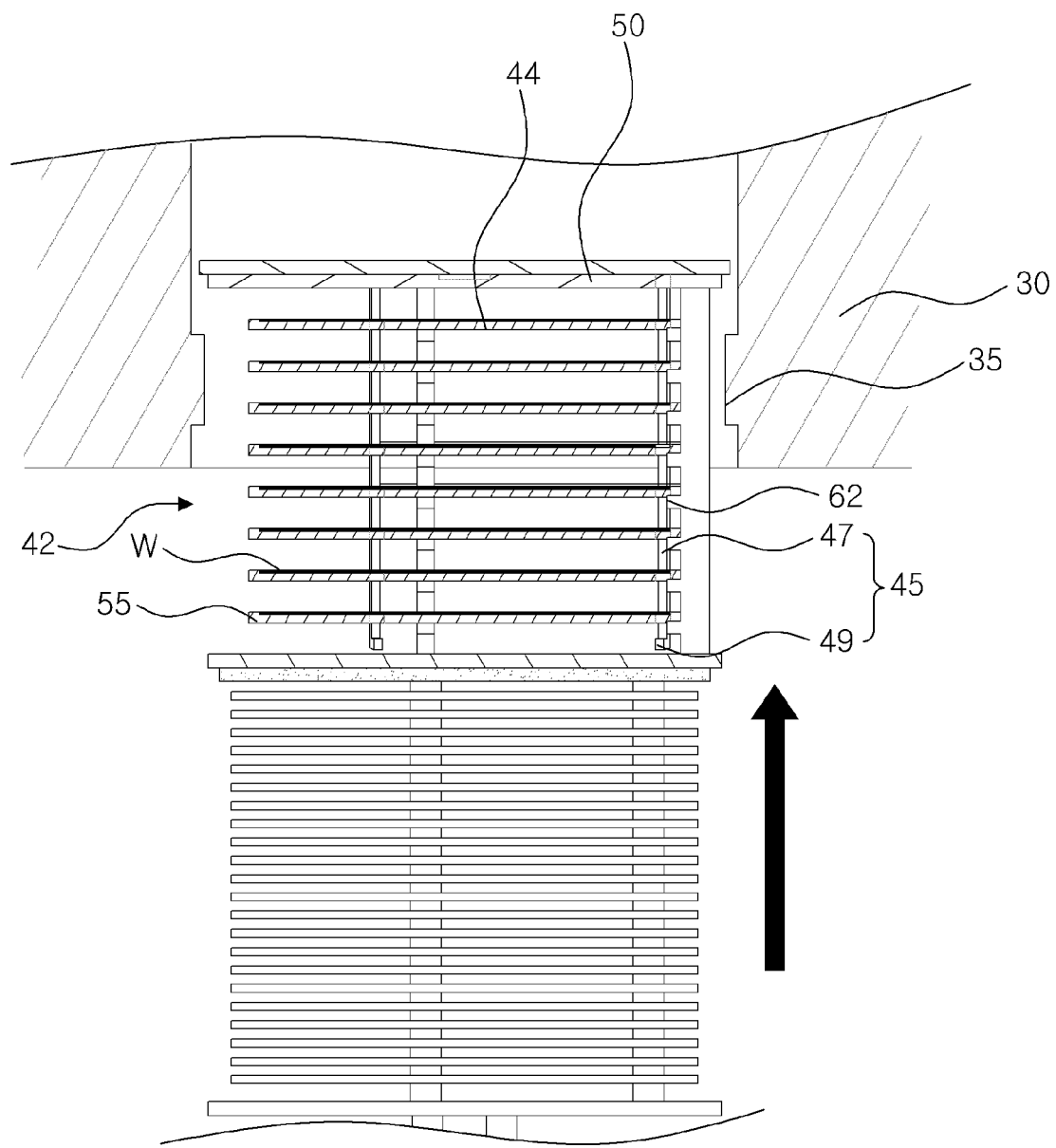

FIGS. 9 to 11 are views of a process in which the boat unit is switched into the process position. Referring to FIGS. 9 to 11, the holder 45 may move through the through hole 52 of the upper blocking plate 50 and the insertion hole 57 of the susceptor 55 as the boat unit 40 is elevated. Thus, the holder 45 may support the substrate W guided from the end-effector 65 to easily load the substrate W again on the susceptor 55. That is to say, the substrate W may be seated on the substrate support tip 49 from the end-effector 65 and successively loaded on the susceptor 55 from the substrate support tip 49.

When the substrates W are loaded from the uppermost susceptor 55 to the lowermost susceptor 55, the upper blocking plate 50 and the grip plate 44 contact each other. As the boat 41 ascends, the upper blocking plate 50 may support the grip plate 44 to ascend together with the grip plate 44. The boat 41 may be switched into the process position to perform the process with respect to the substrate W. A guide groove 51 may be defined in a top surface of the upper blocking plate 50. A guide protrusion (not shown) having a shape corresponding to that of the guide groove 51 may be disposed on a bottom surface of the grip plate 44. Thus, as the boat 41 ascends, the guide protrusion and the guide groove 51 may be stably connected to each other to ascend in a state where the guide protrusion is inserted into the guide groove 51.

That is, according to the substrate processing apparatus of the present invention, the substrate W may be loaded on the susceptor 55 to prevent the process gas from being introduced onto the rear surface of the substrate W. Also, when the process with respect to the substrate W is performed in the state where the substrate W is loaded on the seat groove 59 defined in the susceptor 55, the film formation on the rear and side surfaces of the substrate W may be minimized. In addition, when the thermal processing with respect to the substrate W is performed in the state where the substrate W is loaded on the susceptor 55, since heat of the substrate W is transmitted through the susceptor 55 in a state where the front surface of the substrate W contacts the susceptor 55, temperature uniformity of the substrate W may be improved. On the other hand, when the substrate W is loaded on the slot, the substrate W may locally contact the susceptor to deteriorate the temperature uniformity of the substrate W. Thus, the substrate processing apparatus 100 according to the present invention may improve the yield and productivity of the substrate W.

Although the present invention is described in detail with reference to the exemplary embodiments, the invention may be embodied in many different forms. Thus, technical idea and scope of claims set forth below are not limited to the preferred embodiments.

INDUSTRIAL APPLICABILITY

The present invention may be applicable to a various apparatus for manufacturing semiconductor or a various method for manufacturing semiconductor.

What is claimed is:

1. A substrate processing apparatus comprising:
   a chamber providing a stacking space in which a substrate is stacked and a process space in which a process with respect to the substrate is performed;
   wherein the chamber has a connection space between the stacking space and the process space;
   a boat comprising at least one boat frame that vertically stands up, the boat being elevated to move into the stacking space and the process space;
   a plurality of susceptors disposed on the boat frame and spaced apart from each other along a longitudinal direction of the boat frame, wherein, as the boat moves into the process space, the substrate is successively loaded on a top surface of each of the plurality of susceptors;
   at least holder comprising a vertical rod disposed parallel to the boat frame and a substrate support tip protruding from an inner surface of the vertical rod to support the substrate, wherein, when the boat moves into the process space, the vertical rod relatively moves along the longitudinal direction of the boat frame; and
   a grip plate disposed in the connection space to block the stacking space and the process space, the grip plate being connected to an upper end of the vertical rod to move together with the boat into the process space when the boat moves from the stacking space to the process space.

2. The substrate processing apparatus of claim 1, wherein the boat frame comprises susceptor support tips protruding from an inner surface thereof to support the susceptor, the susceptor support tips being spaced apart from each other along the longitudinal direction of the boat frame.

3. The substrate processing apparatus of claim 1, wherein the chamber comprises:

a lower chamber having an opened upper portion and a passage that is defined in one side thereof so that the substrate is accessible, the lower chamber providing the stacking space; and an upper chamber disposed on the lower chamber and having an opened lower portion communicating with the opened upper portion of the lower chamber, the upper chamber providing the process space.

4. The substrate processing apparatus of claim 1, further comprising a support ring disposed in the connection space, the support ring comprising a support protrusion protruding from an inner surface thereof to support the grip plate that is placed thereon.

5. The substrate processing apparatus of claim 1, wherein the holder relatively moves through an insertion hole defined in the susceptor when the boat moves into the process space.

6. The substrate processing apparatus of claim 1, wherein the susceptor has a seat groove that is recessed from a top surface of the susceptor and has a shape corresponding to that of the substrate, wherein the substrate is seated in the seat groove.

7. The substrate processing apparatus of claim 1, further comprising an upper blocking plate connected to an upper portion of the boat frame to left the grip plate when the boat moves into the process space.

8. The substrate processing apparatus of claim 7, wherein the upper blocking plate has a through hole defined in a position correspond to that of the holder, and the holder is movable through the through hole when the boat moves into the process space.

\* \* \* \* \*